United States Patent
Ellendula et al.

(10) Patent No.: US 12,422,462 B2
(45) Date of Patent: Sep. 23, 2025

(54) SYSTEMS AND METHODS FOR DETECTING MISWIRING OF A POWER CONDITIONER

(71) Applicant: SCHNEIDER ELECTRIC IT CORPORATION, Foxboro, MA (US)

(72) Inventors: Shiva Prasad Ellendula, Karnataka (IN); SoundaraMohan Ponnusamy, Karnataka (IN); Pradeep Tolakanahalli Nagabhushanrao, Bangalore (IN); Mahendrakumar Haribhau Lipare, Bangalore (IN)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 264 days.

(21) Appl. No.: 18/134,595

(22) Filed: Apr. 14, 2023

(65) Prior Publication Data
US 2024/0264214 A1  Aug. 8, 2024

(30) Foreign Application Priority Data
Feb. 8, 2023 (IN) .............. 202311008134

(51) Int. Cl.
*G01R 31/08* (2020.01)
*G01R 31/66* (2020.01)

(52) U.S. Cl.
CPC ........... *G01R 31/086* (2013.01); *G01R 31/66* (2020.01)

(58) Field of Classification Search
CPC ....... G01R 31/086; G01R 31/66; G01R 31/42
See application file for complete search history.

(56) References Cited

U.S. PATENT DOCUMENTS

| | | | | |
|---|---|---|---|---|
| 4,652,770 A * | 3/1987 | Kumano | ................. | H02J 9/062 307/66 |
| 2012/0026764 A1* | 2/2012 | Giuntini | .................. | H02J 9/005 363/69 |
| 2014/0021789 A1* | 1/2014 | Greer | ........................ | H02J 9/06 307/64 |
| 2017/0093332 A1* | 3/2017 | Lee | .......................... | H02S 40/32 |
| 2021/0328494 A1* | 10/2021 | Iida | ..................... | H02M 1/0009 |
| 2023/0216297 A1* | 7/2023 | Peri | .......................... | H02J 3/14 307/43 |

FOREIGN PATENT DOCUMENTS

| | | |
|---|---|---|
| EP | 4064518 A1 | 9/2022 |
| JP | 2013123343 A | 6/2013 |

OTHER PUBLICATIONS

Extended European Search Report from corresponding European Application No. 24154129.1 dated Aug. 8, 2024.

* cited by examiner

*Primary Examiner* — Akm Zakaria
(74) *Attorney, Agent, or Firm* — Lando & Anastasi, LLP

(57) ABSTRACT

A power conditioner includes an input configured to be coupled to a main-power source and an output configured to receive power from within the power conditioner from the main-power source, a backup-power source, or both. The power conditioner includes an inverter, at least one processor, and a memory storing instructions that, when executed by the processor, cause the processor to perform a method. The method includes receiving an inverter-off signal, receiving an output-voltage level above a threshold output-voltage level, and preventing activation of the inverter in response to at least receiving the inverter-off signal and the output-voltage level above the threshold output-voltage level.

21 Claims, 5 Drawing Sheets

SYSTEMS AND METHODS FOR DETECTING MISWIRING OF A POWER CONDITIONER

CROSS-REFERENCE TO RELATED APPLICATIONS

This application claims priority under 35 U.S.C § 119 to Indian Patent Application Serial No. 202311008134, titled "SYSTEMS AND METHODS FOR DETECTING MISWIRING OF A POWER CONDITIONER," filed on Feb. 8, 2023, which is hereby incorporated herein by reference in its entirety for all purposes.

TECHNICAL FIELD

The present disclosure provides a power conditioner. In particular, in some embodiments, the power conditioner may detect miswiring.

BACKGROUND

Power conditioners, such as Uninterruptible Power Supply (UPS) systems, provide conditioned power to sensitive and/or critical loads (e.g., computer systems and/or other data-processing systems). When a main-power source, such as a utility mains, provides power that falls outside a user's or a load's specifications, the power conditioner may provide conditioned power that falls within the user's or load's specification. This conditioned power may be derived from the main-power source and conditioned before being applied to the load. The conditioned power may be derived from the main-power source, stored in a backup-power source, and conditioned before being applied to the load. The conditioned power may be derived from a backup-power source (e.g., a photovoltaic system) that receives power from a source independent of the main-power source before being conditioned and applied to the load.

The power conditioner may have a first connector (e.g., an input connector) to which the main-power source may be coupled. The power conditioner may have a second connector to which a backup-power source may be coupled. The power conditioner may have a third connector (e.g., an output connector) to which a load may be coupled.

SUMMARY

Consistent with disclosed embodiments, a power conditioner may include an input configured to be coupled to a main-power source; an output configured to receive power from within the power conditioner from at least one of the main-power source or a backup-power source; an inverter; at least one processor; and a memory storing instructions that, when executed by the processor, cause the at least one processor to perform a method. The method may include receiving an inverter-off signal, receiving an output-voltage level above a threshold output-voltage level, and preventing activation of the inverter in response to at least receiving the inverter-off signal and the output-voltage level above the threshold output-voltage level. The method may include receiving an inverter-activation signal and preventing activation of the inverter in response to at least receiving the inverter-activation signal. The method may include outputting a miswiring signal in response to receiving at least the output-voltage level and the inverter-off signal and the output-voltage level above the threshold output-voltage level. The method may include preventing activation of the inverter in response to at least determining that the output-voltage level is above the threshold output-voltage level for at least a threshold time. The power conditioner may be configured to display a miswiring message in response to the processor receiving at least the output-voltage level above the threshold output-voltage level and receiving the inverter-off signal. The power conditioner may be a three-phase power conditioner. The processor may perform the method when a power source is connected to the output from without the power conditioner. The method may include receiving a bypass-off signal and preventing activation of the inverter in response to at least receiving the bypass-off signal. The bypass-off signal may be received only if a power source is connected to the input.

Consistent with disclosed embodiments, a non-transitory computer-readable medium may store a set of instructions that may be executed by at least one processor to perform a method for detecting miswiring of a power conditioner comprising an inverter. The method may include receiving an inverter-off signal; receiving an output-voltage level above a threshold output-voltage level; and preventing activation of the inverter in response to at least receiving the inverter-off signal and the output-voltage level above the threshold output-voltage level. The method may include receiving an inverter-activation signal and preventing activation of the inverter in response to at least receiving the inverter-activation signal. The method may include outputting a miswiring signal in response to receiving at least the inverter-off signal and the output-voltage level above the threshold output-voltage level. The method may include preventing activation of the inverter in response to at least determining that the output-voltage level is above the threshold output-voltage level for at least a threshold time. The method may include outputting a miswiring signal to control a display to display a miswiring message in response to the processor receiving at least the output-voltage level above the threshold output-voltage level and receiving the inverter-off signal. The power conditioner may be a three-phase power conditioner. The processor may perform the method when a power source is connected to an output of the power conditioner from without the power conditioner. The method may include receiving a bypass-off signal and preventing activation of the inverter in response to at least receiving the bypass-off signal. The bypass-off signal may be received only if a power source is connected to the input.

Consistent with disclosed embodiments, a method for detecting miswiring of a power conditioner comprising an inverter may include receiving an inverter-off signal, receiving an output-voltage level above a threshold output-voltage level, and preventing activation of the inverter in response to at least receiving the inverter-off signal and the output-voltage level above the threshold output-voltage level. The method may include receiving an inverter-activation signal and preventing activation of the inverter in response to at least receiving the inverter-activation signal. The method may include outputting a miswiring signal in response to receiving at least the inverter-off signal and the output-voltage level above the threshold output-voltage level. The method may include preventing activation of the inverter in response to at least determining that the output-voltage level is above the threshold output-voltage level for at least a threshold time.

The foregoing general description and the following detailed description are exemplary and explanatory only and are not restrictive of the claims.

Other objects and features will be in part apparent and in part pointed out hereinafter.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments and are incorporated in and constitute a part of this specification but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

In view of the shortcomings of current systems and methods, improved systems and methods for providing the same are desired.

As described in further detail herein, exemplary embodiments disclosed herein are directed to a power conditioner that may detect miswiring. Miswiring may occur when a user or installer ("user") connects a power source to the power conditioner's output. The power source connected to the output may be, for example, a main-power source or a backup-power source. If an inverter in the power conditioner is activated while the power conditioner is miswired, one or more components in the power conditioner may be damaged. For example, one or more inverter switches may be damaged.

Reference will now be made in detail to exemplary embodiments, examples of which are illustrated in the accompanying drawings and disclosed herein.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all the described terms. In addition, in the event of inconsistent usages of terms between this document and documents incorporated herein by reference, the term usage in the incorporated references is supplementary to that of this document; for irreconcilable inconsistencies, the term usage in this document controls.

Figure 1:
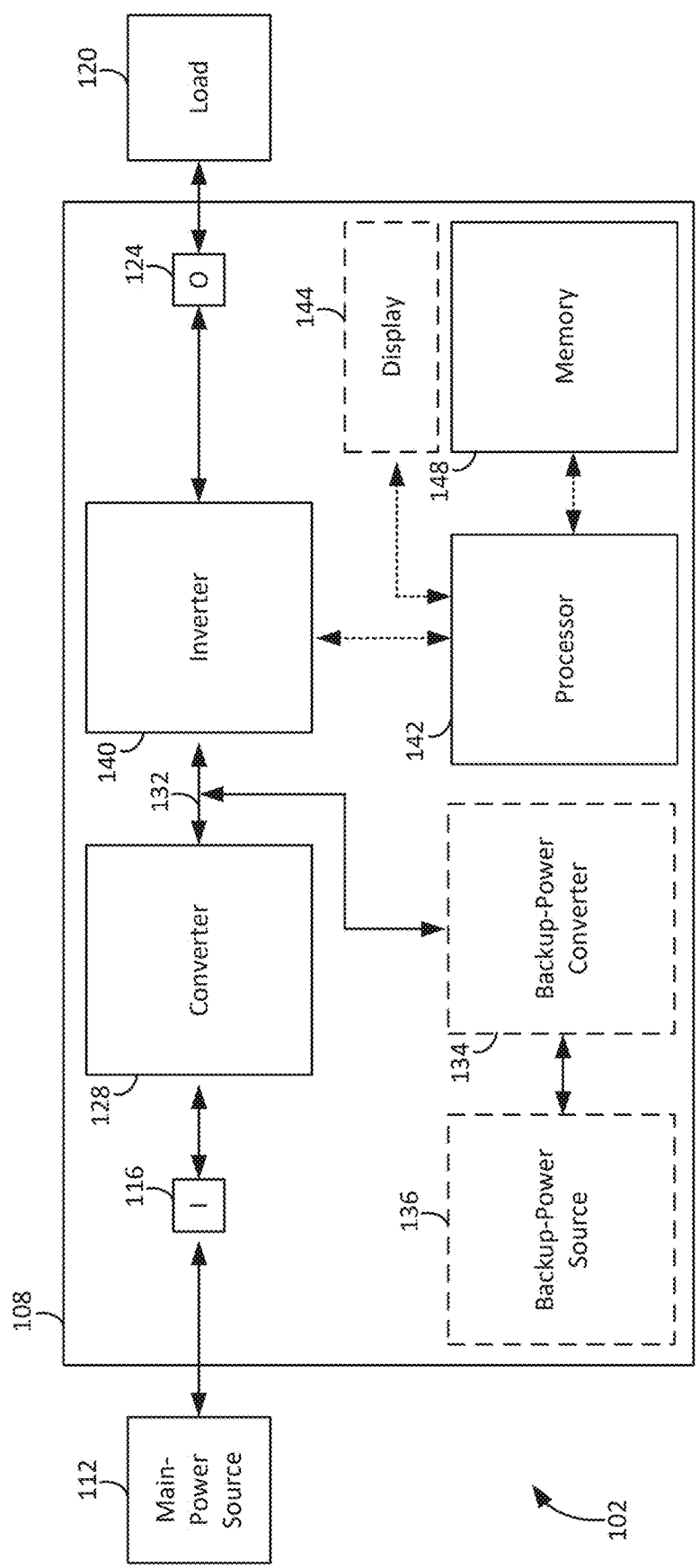
FIG. 1 is a diagram of an exemplary system environment within which an exemplary power conditioner may operate.

FIG. 1 is a diagram of an exemplary system environment 102 within which an exemplary power conditioner 108 may operate. Power conditioner 108 may be a single-phase system or a polyphase system (e.g., a three-phase system). System environment 108 may include one or more main-power source 112 coupled to an input 116 of power conditioner 108. The one or more main-power source 112 may be one or more mains-power sources. System environment 102 may include a load 120 coupled to an output 124 of power conditioner 108. Power conditioner 108 may include a converter 128 that accepts an Alternating Current (AC) power and converts it to a Direct Current (DC) power signal. The DC power may be outputted to a DC bus 132. In some embodiments, power conditioner 108 may include a backup-power converter 134 which converts the DC power from a first voltage to a second voltage. In some embodiments, the DC power at the second voltage may be stored in a backup-power source 136, such as a battery. Backup-power converter 134 may be internal or external to power conditioner 108. Backup-power source 136 may be internal or external to power conditioner 108. If backup-power converter 134 or backup-power source 136 are external to power conditioner 108, power conditioner 108 may have a second input to which backup-power converter 134 or backup-power source 136 may be coupled. In some embodiments, backup-power source 136 may be an external power source that derives its energy from a source independent of main-power source 112. For example, backup-power source 136 may be a photovoltaic system or a backup mains. Power conditioner 108 may include an inverter 140 that inverts the DC power at the first voltage into a conditioned AC power signal. The DC power may be derived from at least one of main-power source 112 or backup-power source 136. The conditioned AC power may be transferred through output 124 to load 120. In this manner, output 124 receives the conditioned AC power from within power conditioner 108. Power conditioner 108 may include one or more processor 142 or other digital controller ("processor") that sends control signals to inverter 140. In some embodiments, power conditioner 108 may include a display 144 that may be controlled by processor 142. Processor 142 may execute instructions stored on a digital memory 148 that may be internal or external to power conditioner 108.

Figure 2:
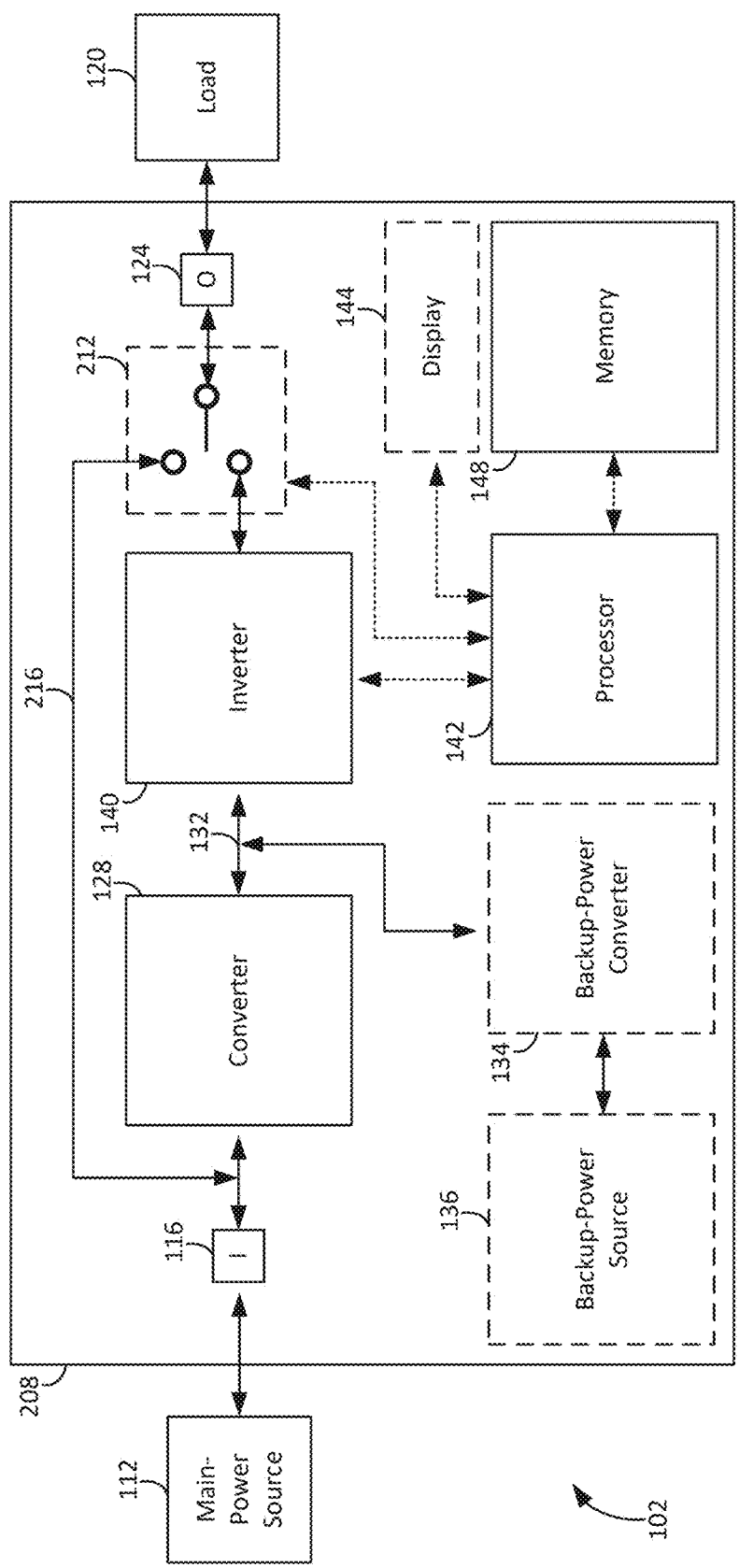
FIG. 2 is another diagram of an exemplary system environment within which an exemplary power conditioner may operate.

FIG. 2 is a diagram of an exemplary system environment 102 within which an exemplary power conditioner 208 may operate. Power conditioner 208 may be similar to power conditioner 108, but power conditioner 208 may include a relay 212 coupled between inverter 140 and output 124. Relay 212 may selectively couple output 124 to inverter 140. In some embodiments, power conditioner 208 may include a bypass line 216, allowing power conditioner 208 to selectively couple input 116 to output 124 through relay 212.

In this manner, control of relay 212 may select whether the AC power is delivered to output 124 through bypass line 216 or whether the conditioned AC power is delivered to output 124 from inverter 140. When relay 212 couples output 124 to inverter 140, the inverter may be considered to be on. When relay 212 coupled output 124 to input 116, the inverter may be considered to be off. One or more processor 142 in power conditioner 208 may send control signals to control relay 212.

Figure 3:
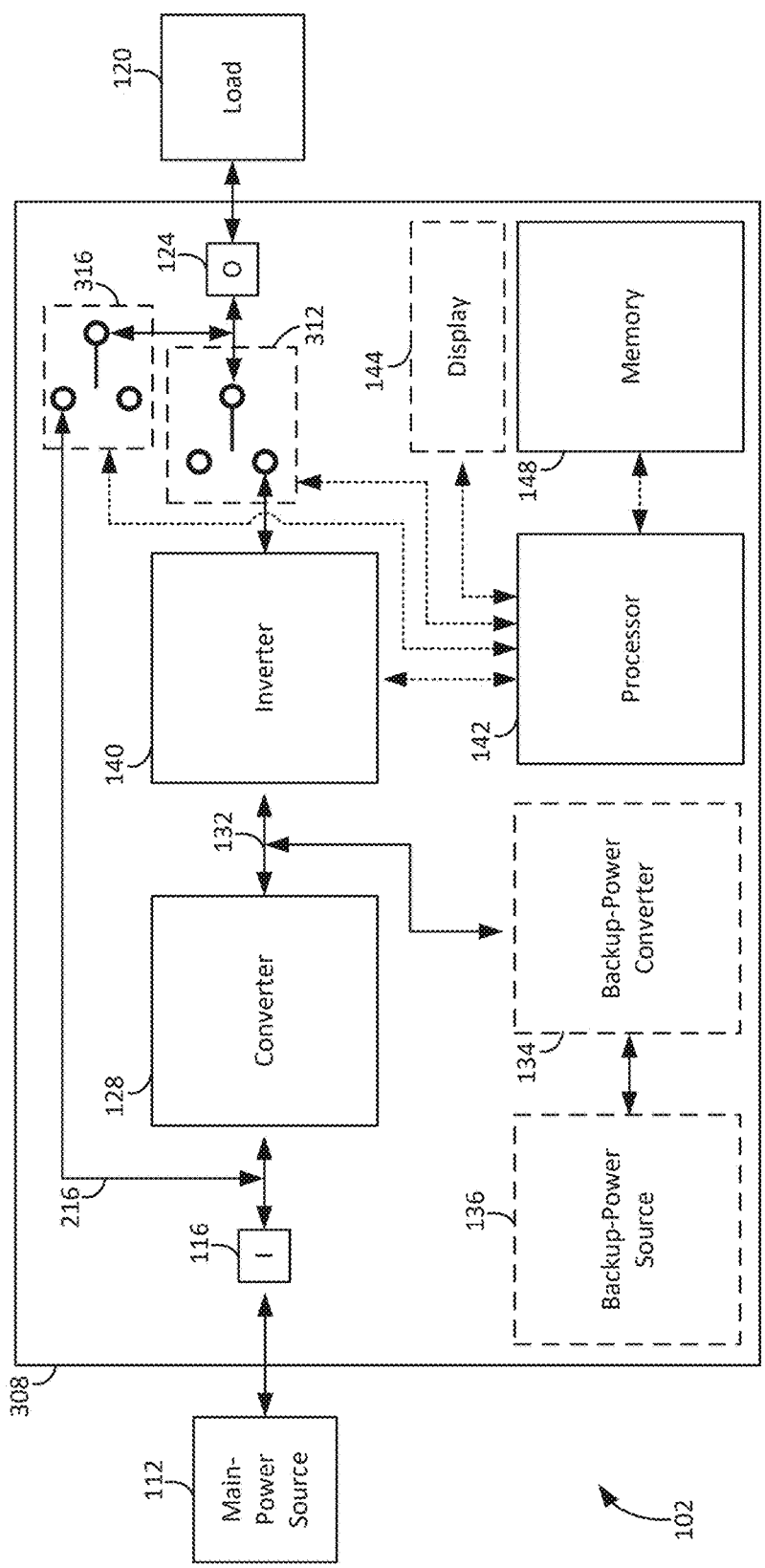
FIG. 3 is another diagram of an exemplary system environment within which an exemplary power conditioner may operate.

FIG. 3 is a diagram of an exemplary system environment 102 within which an exemplary power conditioner 308 may operate. Power conditioner 308 may be similar to power conditioner 208, but power conditioner 308 may have two or more relays in place of relay 212. For example, power conditioner 308 may include an inverter relay 312 and a bypass relay 316. When power conditioner 308 is intended to provide the AC power to output 124, inverter relay 312 may decouple output 124 from inverter 140 and bypass relay 316 may couple output 124 to input 116. In this configuration, inverter 140 may be considered to be off. When power conditioner 308 is intended to provide the conditioned AC power to output 124, inverter relay 312 may couple output 124 to inverter 140 and bypass relay 316 may decouple output 124 from input 116. In this configuration, inverter 140 may be considered to be on. One or more processor 142 in power conditioner 308 may send control signals to control inverter relay 312 and/or bypass relay 316.

In some embodiments, a user may inadvertently or maliciously connect main-power source 112 to output 124. A user may inadvertently or maliciously connect backup-power source 136 to output 124 (e.g., if backup-power source 136 is external to power conditioner 108). In these cases, power conditioner 108 may be considered miswired. In these cases, a power source is connected to output 124 from without power conditioner 108. When power conditioner 108 is miswired, one or more components in power conditioner 108 may be damaged when inverter 140 is put into an on state. For example, one or more switches in inverter 140 may be damaged. This damage may occur when the conditioned AC power outputted by inverter 140 is different from the power outputted by main-power source 112 when main-power source 112 is connected to output 124. This damage may occur when the conditioned AC power outputted by inverter 140 is different from the power outputted by backup-power source 136 when backup-power source 136 is connected to output 124. The difference may be a difference in phase or in voltage-amplitude, causing a high current to travel through switches in inverter 140. Switches in inverter 140 may be, for example, transistors, relays, or other types of switches. To prevent damage to internal components power conditioner 108 may perform one or more methods to detect miswiring.

Figure 4:
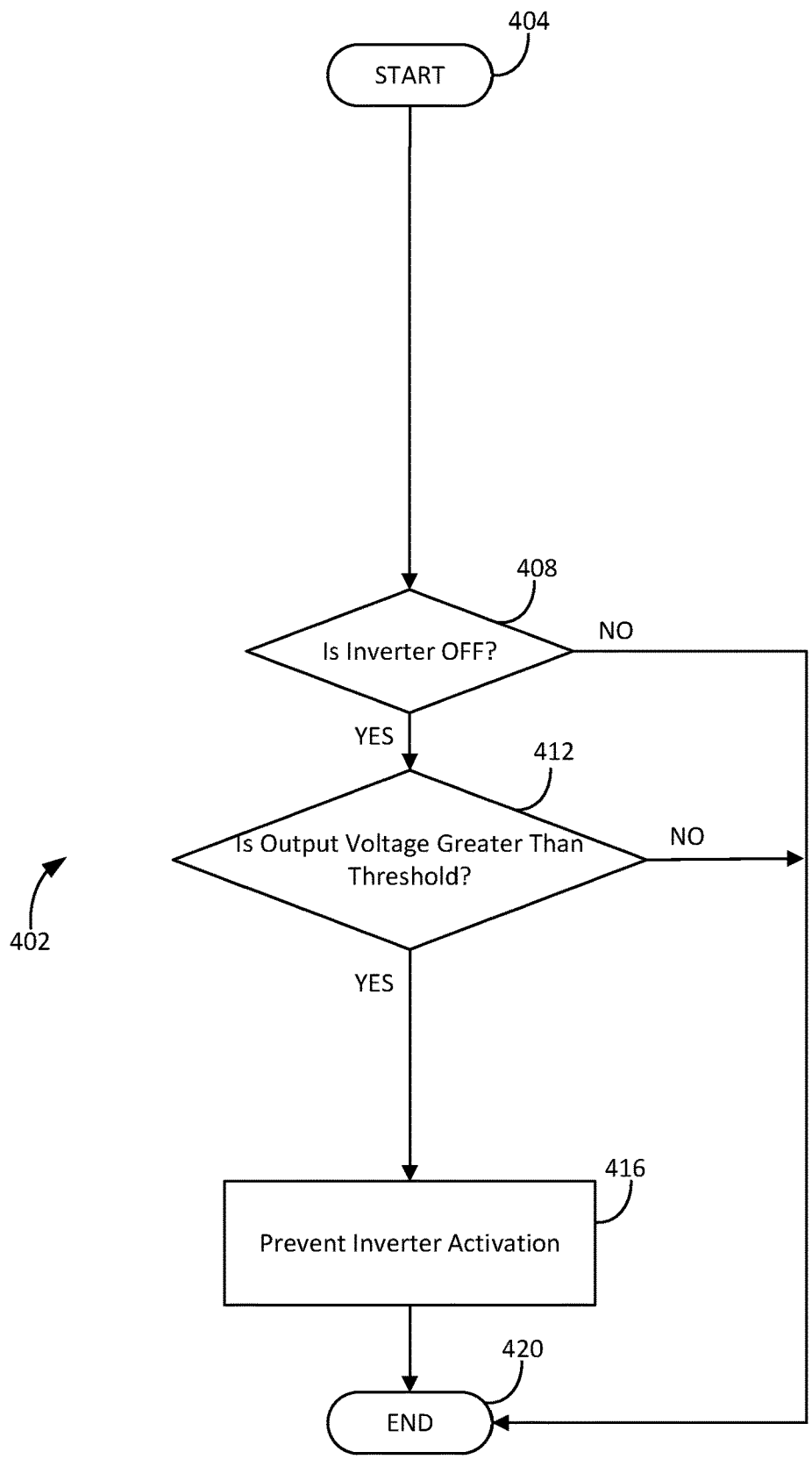
FIG. 4 is a flow chart illustrating an exemplary method for detecting miswiring.

FIG. 4 is a flow chart illustrating an exemplary method 402 for detecting miswiring. In some embodiments, power conditioner 108 may perform one or more methods to detect miswiring, such as exemplary method 402. Exemplary method 402 may start at step 404. At step 408, processor 142 may receive an inverter-off signal. This control signal may be received by processor 142 based on a user selection on a user interface, a sensed voltage, current, or relay position by a sensor, or data from another component of power conditioner 108. The inverter-off signal may be used to instruct power conditioner 108 to put inverter 140 into an off state. By receiving the inverter-off signal, processor 142 may determine that inverter 140 is disabled. At step 412, power conditioner 108 may determine whether the output voltage on output 124 is greater than a threshold voltage. The output voltage may be sensed with a voltage sensor. The threshold voltage may be a percentage of the desired output voltage (e.g., about 25%, about 50%, or about 75%). If power conditioner 108 receives the inverter-off signal and determines that the output voltage is greater than the threshold voltage, power conditioner 108 may prevent inverter activation at step 416. For example, if a user attempts to activate the inverter by causing processor 142 to receive an inverter-activation signal (e.g., by making a selection on a user interface) or a bypass-off signal (e.g., by making a selection on a user interface), power conditioner 108 may prevent this activation. A bypass-off signal may be a control signal that causes power conditioner 108 to decouple bypass line 216 from output 124. A bypass-off signal may be a signal that indicates to processor 142 that output 124 is decoupled from bypass line 216. In some embodiments, preventing activation of inverter 140 may include processor 142 outputting a miswiring signal to one or more components internal or external to power conditioner 108. In some embodiments, preventing activation of inverter 140 may include processor 142 controlling display 144 by outputting the miswiring signal to display a message to a user on display 144. The message may indicate to the user that power conditioner 108 is miswired. If processor 142 does not receive the inverter-off signal or the output voltage is less than or equal to the threshold voltage, power conditioner 108 may end method 402. It is to be understood that one or more steps of method 402 may be performed in a different sequence.

Figure 5:
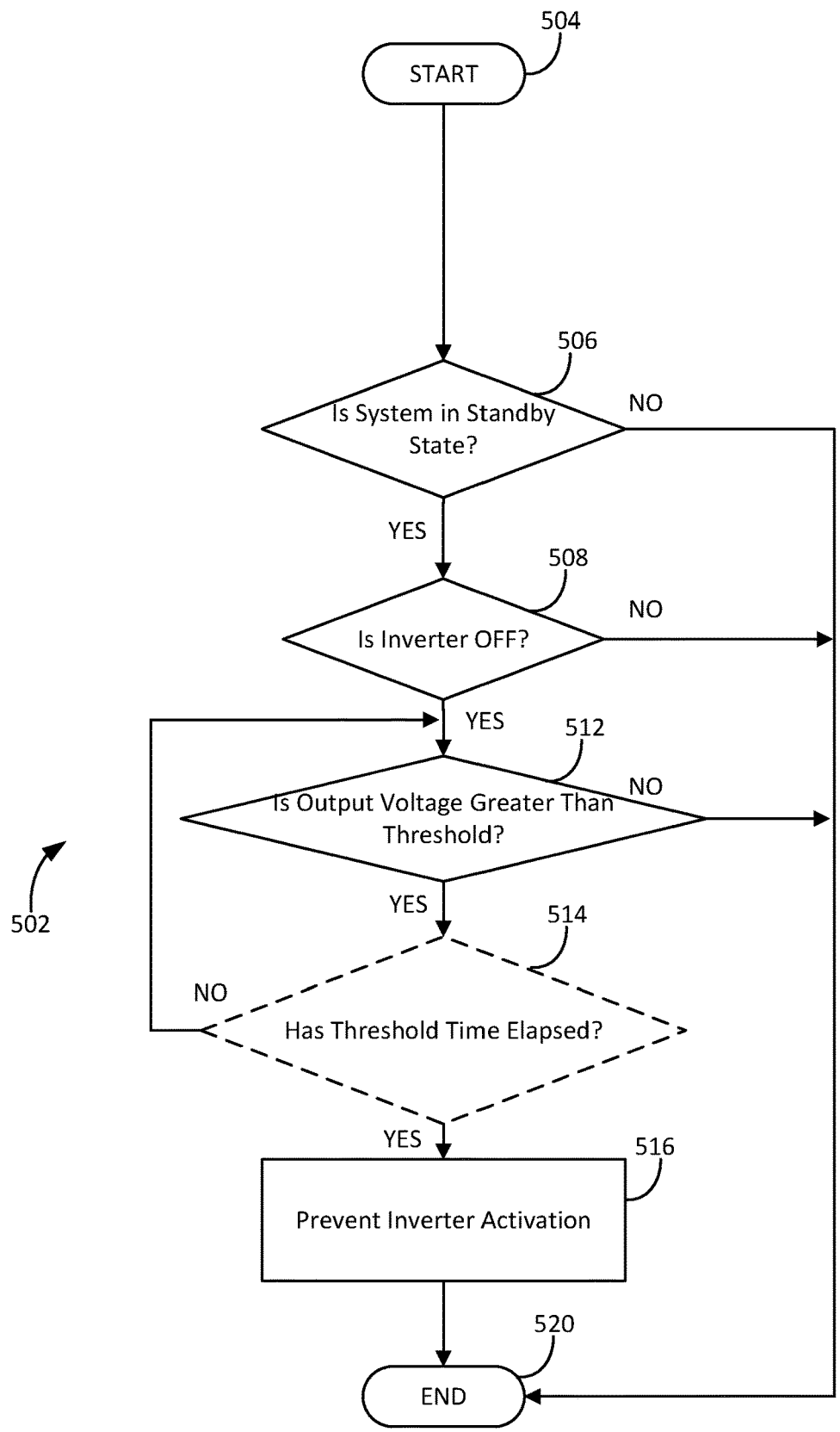
FIG. 5 is another flow chart illustrating an exemplary method for detecting miswiring.

FIG. 5 is a flow chart illustrating an exemplary method 502 for detecting miswiring. In some embodiments, power conditioner 108 may perform exemplary method 502 to detect miswiring. Exemplary method 502 may start at step 504. Step 506 may include power conditioner 108 checking its state when, for example, it powers up. Step 506 may include power conditioner 108 determining whether it is in a standby state. The standby state may include a state where a voltage is present on input 116. The standby state may include a state where the voltage present on input 116 is greater than a threshold voltage. The threshold voltage may be determined based on, for example, an intended output voltage. For example, the threshold voltage may be within a certain percent deviation from the intended output voltage (e.g., about 25%, about 50%, or about 75%). In some embodiments, step 506 may be performed when power conditioner 108 is powered on. If power conditioner 108 is not in a standby state, method 502 may end. In some embodiments, step 506 may include repeating step 506 until power conditioner 108 is in a standby state or is powered off. At step 508, processor 142 may receive an inverter-off signal. This control signal may be received by processor 142 based on a user selection on a user interface, a sensed voltage, current, or relay position by a sensor, or data from another component of power conditioner 108. The inverter-off signal may be used to instruct power conditioner 108 to put inverter 140 into an off state. By receiving the inverter-off signal, processor 142 may determine that inverter 140 is disabled. In some embodiments, step 508 may include repeating step 508 until processor 142 receives the inverter-off signal. At step 512, power conditioner 108 may determine whether the output voltage on output 124 is greater than a threshold voltage. The threshold voltage may be a percentage of the desired output voltage (e.g., about 25%, about 50%, or about 75%). The output voltage may be sensed with a voltage sensor. In some embodiments, step 512 may include repeating step 512 until processor 142 determines that the output voltage on output 124 is greater than a threshold voltage. Optionally, in some embodiments, at step 514, power conditioner 108 may proceed to step 516 if processor 142 determines that the output voltage on output 124 is greater than a threshold voltage for a threshold time duration (e.g., about 500 milliseconds, about 1 second, or about 2 seconds). If power conditioner 108 determines that it is in a standby state, receives the inverter-off signal, and determines that the output voltage is greater than the threshold voltage, power conditioner 108 may prevent inverter activation at step 516. In some embodiments, if power conditioner 108 determines that it is in a standby state, receives the inverter-off signal, and determines that the output voltage is greater than the threshold voltage for a threshold time duration, power conditioner 108 may prevent inverter activation at step 516. For example, if a user attempts to activate the inverter by causing processor 142 to receive an inverter-activation signal (e.g., by making a selection on a user interface) or a bypass-off signal (e.g., by making a selection on a user interface), power conditioner 108 may prevent this activation. A bypass-off signal may be a control signal that causes power conditioner 108 to decouple bypass line 216 from output 124. In some embodiments, preventing activation of inverter 140 may include processor 142 controlling display 144 to display a message to a user on display 144. The message may indicate to the user that power conditioner 108 is miswired. If power conditioner 108 determines it is not in a standby state or if processor 142 does not receive the inverter-off signal or if the output voltage is less than or equal to the threshold voltage, power conditioner 108 may end method 502. In some embodiments, if power conditioner 108 determines it is not in a standby state or if processor 142 does not receive the inverter-off signal or if the output voltage is less than or equal to the threshold voltage for the threshold time duration, power conditioner 108 may end method 502. It is to be understood that one or more steps of method 502 may be performed in a different sequence.

Embodiments of the present disclosure may comprise a special purpose computer including a variety of computer hardware, as described in greater detail below.

Embodiments within the scope of the present disclosure may also include computer-readable media for carrying or having computer-executable instructions or data structures stored thereon. Such computer-readable media can be any available media that can be accessed by a special purpose computer and comprises computer storage media and communication media. By way of example, and not limitation, computer storage media include both volatile and nonvolatile, removable and non-removable media implemented in any method or technology for storage of information such as computer-readable instructions, data structures, program modules or other data. Computer storage media are non-transitory and include, but are not limited to, random access memory (RAM), read only memory (ROM), electrically erasable programmable ROM (EEPROM), compact disk ROM (CD-ROM), digital versatile disks (DVD), or other optical disk storage, solid state drives (SSDs), magnetic cassettes, magnetic tape, magnetic disk storage, or other magnetic storage devices, or any other medium that can be used to carry or store desired non-transitory information in the form of computer-executable instructions or data structures and that can be accessed by a computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media. Computer-executable instructions comprise, for example, instructions and data which cause a general-purpose computer, special purpose computer, or special purpose processing device to perform a certain function or group of functions.

The following discussion is intended to provide a brief, general description of a suitable computing environment in which aspects of the disclosure may be implemented. Although not required, aspects of the disclosure will be described in the general context of computer-executable instructions, such as program modules, being executed by computers in network environments. Generally, program modules include routines, programs, objects, components, data structures, etc. that perform particular tasks or implement particular abstract data types. Computer-executable instructions, associated data structures, and program modules represent examples of the program code means for executing steps of the methods disclosed herein. The particular sequence of such executable instructions or associated data structures represent examples of corresponding acts for implementing the functions described in such steps.

Those skilled in the art will appreciate that aspects of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Aspects of the disclosure may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

An exemplary system for implementing aspects of the disclosure includes a special purpose computing device in the form of a conventional computer, including a processing unit, a system memory, and a system bus that couples various system components including the system memory to the processing unit. The system bus may be any of several types of bus structures including a memory bus or memory controller, a peripheral bus, and a local bus using any of a variety of bus architectures. The system memory includes computer storage media, including nonvolatile and volatile memory types. A basic input/output system (BIOS), containing the basic routines that help transfer information between elements within the computer, such as during start-up, may be stored in ROM. Further, the computer may include any device (e.g., computer, laptop, tablet, PDA, cell phone, mobile phone, a smart television, and the like) that is capable of receiving or transmitting an IP address wirelessly to or from the internet.

The computer may also include a magnetic hard disk drive for reading from and writing to a magnetic hard disk, a magnetic disk drive for reading from or writing to a removable magnetic disk, and an optical disk drive for reading from or writing to removable optical disk such as a CD-ROM or other optical media. The magnetic hard disk drive, magnetic disk drive, and optical disk drive are connected to the system bus by a hard disk drive interface, a magnetic disk drive-interface, and an optical drive interface, respectively. The drives and their associated computer-readable media provide nonvolatile storage of computer-executable instructions, data structures, program modules, and other data for the computer. Although the exemplary environment described herein may employ a magnetic hard disk, a removable magnetic disk, and a removable optical disk, other types of computer readable media for storing data can be used, including magnetic cassettes, flash memory cards, digital video disks, Bernoulli cartridges, RAMs, ROMs, SSDs, and the like.

The computer may operate in a networked environment using logical connections to one or more remote computers. The remote computers may each be another personal computer, a tablet, a PDA, a server, a router, a network PC, a peer device, or other common network node, and typically include many or all of the elements described above relative to the computer. The logical connections include a local area network (LAN) and a wide area network (WAN) that are presented here by way of example and not limitation. Such networking environments are commonplace in office-wide or enterprise-wide computer networks, intranets and the Internet.

When used in a LAN networking environment, the computer is connected to the local network through a network interface or adapter. When used in a WAN networking environment, the computer may include a modem, a wireless link, or other means for establishing communications over the wide area network, such as the Internet. The modem, which may be internal or external, is connected to the system bus via the serial port interface. In a networked environment, program modules depicted relative to the computer, or portions thereof, may be stored in the remote memory storage device. It will be appreciated that the network connections shown are exemplary and other means of establishing communications over wide area network may be used.

When introducing elements of aspects of the disclosure or the embodiments thereof, the articles "a", "an", "the" and "said" are intended to mean that there are one or more of the elements. The terms "comprising", "including", and "having" are intended to be inclusive and mean that there may be additional elements other than the listed elements. Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

What is claimed is:

1. A power conditioner, comprising:
    an input configured to be coupled to a main-power source;
    an output configured to receive power from within the power conditioner from at least one of the main-power source or a backup-power source;
    an inverter;
    a bypass line coupled to the input;
    at least one relay coupled to the bypass line, the inverter, and the output; and
    at least one processor configured to receive an inverter-off signal, the inverter-off signal including an instruction to decouple the inverter from the output,
        receive a sense signal indicative of an output-voltage level,
        determine based on the sense signal that the output-voltage level is above a threshold output-voltage level, and
        prevent activation of the inverter by controlling the at least one relay to selectively decouple the inverter from the output and selectively couple the output to the bypass line in response to at least receiving the inverter-off signal and determining that the output-voltage level is above the threshold output-voltage level.

2. The power conditioner of claim 1, wherein the at least one processor is further configured to receive an inverter-activation signal and prevent activation of the inverter in response to at least receiving the inverter-activation signal.

3. The power conditioner of claim 1, wherein the at least one processor is further configured to output a miswiring signal in response to at least receiving the inverter-off signal and determining that the output-voltage level is above the threshold output-voltage level.

4. The power conditioner of claim 1, wherein the at least one processor is further configured to prevent activation of the inverter in response to at least determining that the output-voltage level is above the threshold output-voltage level for at least a threshold time.

5. The power conditioner of claim 1, wherein the power conditioner is configured to display a miswiring message in response to the at least one processor at least determining that the output-voltage level is above the threshold output-voltage level and receiving the inverter-off signal.

6. The power conditioner of claim 1, wherein the power conditioner is a three-phase power conditioner.

7. The power conditioner of claim 1, wherein the output-voltage level is above the threshold output-voltage level when a power source is connected to the output from without the power conditioner.

8. The power conditioner of claim 1, wherein the at least one processor is further configured to receive a bypass-off signal and prevent activation of the inverter in response to at least receiving the bypass-off signal, the bypass-off signal including an instruction to operate the at least one relay to decouple the output from a bypass line of the power conditioner.

9. The power conditioner of claim 8, wherein receiving the bypass-off signal is performed only if a power source is connected to the input.

10. A non-transitory computer-readable medium storing a set of instructions for detecting miswiring of a power conditioner including an input, an inverter, an output, a bypass line coupled to the input, and at least one relay coupled to the bypass line, the inverter, and the output, the set of instructions including instructions that instruct at least one processor to:
    receive an inverter-off signal, the inverter-off signal including an instruction to decouple the inverter from the output;
    receive a sense signal indicative of an output-voltage level;
    determine based on the sense signal that the output-voltage level is above a threshold output-voltage level; and
    prevent activation of the inverter by controlling the at least one relay to selectively decouple the inverter from the output and selectively couple the output to the bypass line in response to at least receiving the inverter-off signal and determining that the output-voltage level is above the threshold output-voltage level.

11. The non-transitory computer-readable medium of claim 10, wherein the set of instructions further instructs the at least one processor to receive an inverter-activation signal and prevent activation of the inverter in response to at least receiving the inverter-activation signal.

12. The non-transitory computer-readable medium of claim 10, wherein the set of instructions further instructs the at least one processor to output a miswiring signal in response to at least receiving the inverter-off signal and determining that the output-voltage level is above the threshold output-voltage level.

13. The non-transitory computer-readable medium of claim 10, wherein the set of instructions further instructs the at least one processor to prevent activation of the inverter in response to at least determining that the output-voltage level is above the threshold output-voltage level for at least a threshold time.

14. The non-transitory computer-readable medium of claim 10, wherein the set of instructions further instructs the at least one processor to output a miswiring signal to control a display to display a miswiring message in response to the at least one processor at least determining that the output-voltage level is above the threshold output-voltage level and receiving the inverter-off signal.

15. The non-transitory computer-readable medium of claim 10, wherein the at least one processor executes the set of instructions when a power source is connected to an output of the power conditioner from without the power conditioner.

16. The non-transitory computer-readable medium of claim 10, wherein:
the set of instructions further instructs the at least one processor to receive a bypass-off signal and prevent activation of the inverter in response to at least receiving the bypass-off signal, the bypass-off signal including an instruction to operate the at least one relay to decouple the output from the bypass line.

17. The non-transitory computer-readable medium of claim 16, wherein receiving the bypass-off signal is performed only if a power source is connected to the input.

18. A method for detecting miswiring of a power conditioner including an inverter, an output, an input, a bypass line coupled to the input, and at least one relay coupled to the bypass line, the inverter, and the output, the method comprising:
receiving an inverter-off signal, the inverter-off signal including an instruction to decouple the inverter from the output;
receiving a sense signal indicative of an output-voltage level;
determining based on the sense signal that the output-voltage level is above a threshold output-voltage level; and
preventing activation of the inverter by controlling the at least one relay to selectively decouple the inverter from the output and selectively couple the output to the bypass line in response to at least receiving the inverter-off signal and determining that the output-voltage level is above the threshold output-voltage level.

19. The method of claim 18, further comprising receiving an inverter-activation signal and preventing activation of the inverter in response to at least receiving the inverter-activation signal.

20. The method of claim 18, further comprising outputting a miswiring signal in response to at least receiving the inverter-off signal and determining that the output-voltage level is above the threshold output-voltage level.

21. The method of claim 18, further comprising preventing activation of the inverter in response to at least determining that the output-voltage level is above the threshold output-voltage level for at least a threshold time.

\* \* \* \* \*